United States Patent
Bourgoin et al.

(10) Patent No.: US 7,982,251 B2
(45) Date of Patent: Jul. 19, 2011

(54) DEVICE FOR DETECTING/STORING ELECTROMAGNETIC BEAMS, METHOD FOR MAKING SAME, AND USE THEREOF AND IMAGER INCORPORATING SAME

(75) Inventors: Jean-Philippe Bourgoin, Voisins le Bretonneux (FR); Vincent Derycke, Montigny le Bretonneux (FR); Julien Borghetti, Cachan (FR)

(73) Assignee: Commissariat a l'Energie Atomique, Paris (FR)

( * ) Notice: Subject to any disclaimer, the term of this patent is extended or adjusted under 35 U.S.C. 154(b) by 103 days.

(21) Appl. No.: 12/282,584

(22) PCT Filed: Mar. 13, 2007

(86) PCT No.: PCT/FR2007/000432
§ 371 (c)(1),
(2), (4) Date: Mar. 9, 2009

(87) PCT Pub. No.: WO2007/104858
PCT Pub. Date: Sep. 20, 2007

(65) Prior Publication Data
US 2009/0179240 A1 Jul. 16, 2009

(30) Foreign Application Priority Data
Mar. 14, 2006 (FR) ...................... 06 02233

(51) Int. Cl.
*H01L 31/10* (2006.01)

(52) U.S. Cl. ................ 257/290; 257/E31.054; 977/834; 977/938; 977/954

(58) Field of Classification Search .................. 257/290, 257/E31.054; 977/834, 938, 954
See application file for complete search history.

(56) References Cited

U.S. PATENT DOCUMENTS
6,992,322 B2 * 1/2006 Narayan .......................... 257/40
(Continued)

FOREIGN PATENT DOCUMENTS
FR 2 873 493 1/2006
(Continued)

OTHER PUBLICATIONS
International Search Report and Written Opinion for PCT/FR2007/000432 filed Mar. 13, 2007.
(Continued)

*Primary Examiner* — Benjamin P Sandvik
*Assistant Examiner* — W. Wendy Kuo
(74) *Attorney, Agent, or Firm* — Alston & Bird LLP

(57) ABSTRACT

The invention concerns a device for detecting and storing electromagnetic beams, an imager incorporating same, a method for making said device and use thereof. The inventive device comprises a field-effect phototransistor including: two source and drain contact electrodes, an electrical conduction unit which is connected to the two contact electrodes and which is coated with a photosensitive polymeric coating capable of absorbing the beams, of detecting, of generating in response the loads detected by said unit and of storing said loads, and a gate electrode which is capable of controlling the electric current in the unit as well as spatially distributing the loads in said coating and which is separated from said unit by a gate dielectric. Said device is configured such that the conduction unit comprises at least one semiconductive nanotube or nanowire capable of supplying an electric signal representing a modification of the conductivity of the phototransistor having been exposed to a beam, and that the gate dielectric has a thickness and a permittivity $\in_r$ which satisfy $\in_r > 0.2$ nm*1, so that the conductivity after exposition may be electrically reset in a reduced time and that the device forms at least one imaging pixel.

20 Claims, 4 Drawing Sheets

U.S. PATENT DOCUMENTS

2006/0132461 A1* 6/2006 Furukawa et al. ............ 345/173

FOREIGN PATENT DOCUMENTS

WO     WO 2005078770 A2 * 8/2005

OTHER PUBLICATIONS

Star A. et al.: "Nanotube Optoelectronic Memory Devices"; Nano Letters; vol. 4, No. 9, Sep. 2004; pp. 1587-1591, XP002414852.

Appenzeller J et al.: "Carbon nanotubes as potential building blocks for future nanoelectronics"; Microelectronic Engineering, Elsevier Publishers BV., Amsterdam, NL, vol. 64, No. 1-4; Oct. 2002; pp. 391-397; XP004381209.

Freitage M et al.: "Photoconductivity of Single Carbon Nanotubes"; Nano Letters, ACS, Washington, DC; vol. 3 No. 8; Jun. 2003; pp. 1067-1071; XP008043676.

Cui J B et al.: "Carbon Nanotube Memory Devices of High Charge Storage Stability"; Applied Physics Letters, AIP, American Institute of Physics, Mellville, NY, US; vol. 81, No. 17; Oct. 21, 2002; pp. 3260-3262; XP012032285.

Balasubramanian Kannan et al.: "Photoelectronic Transport Imaging of Individual Semiconducting Carbon Nanotubes"; Applied Physics Letters, AIP, American Institute of Physics, Melville, NY, US; vol. 84, No. 13; Mar. 29, 2004; pp. 2400-2402, XP012060945.

Steuerman D W et al.: "Interactions Between Conjugated Polymers and Single-Walled Carbon Nanotubes"; Journal of Physical Chemistry. B Materials, Surfaces, Interfaces and Biophysical, Washington, DC, US; vol. 106, No. 12; Mar. 28, 2002; pp. 3124-3130.

Winds S J et al.: "Carbon Nanotube Devices for Future Nanoelectronics"; Nanotechnology, 2003. IEEE-NANO 2003. 2003 Third IEEE Conference on Aug. 12-14, 2003, Piscataway, NJ, USA; pp. 236-239; XP010658014.

* cited by examiner

DEVICE FOR DETECTING/STORING ELECTROMAGNETIC BEAMS, METHOD FOR MAKING SAME, AND USE THEREOF AND IMAGER INCORPORATING SAME

CROSS REFERENCE TO RELATED APPLICATIONS

This application is a national stage application filed under 35 U.S.C. 371 of International Application No. PCT/FR2007/000432, filed Mar. 13, 2007, which claims priority from French patent application 06 02233, filed Mar. 14, 2006.

FIELD AND BACKGROUND OF THE INVENTION

The present invention relates to an electromagnetic radiation detection and storage device, to an imager incorporating it, to a process for fabricating said device and to a use of the latter. The invention applies to a device which comprises a field-effect phototransistor and is designed to form at least one imaging pixel.

Electromagnetic radiation sensors for imaging constitute an expanding field of research. In general, to produce a pixel of an imager, it is necessary to have, on the one hand, a light radiation sensor associated with a transducer for delivering an electrical signal proportional to the number of photons received over a given exposure time and, on the other hand, a resetting device intended to reset this pixel to its state prior to said light radiation.

One solution widely employed up to the end of the 1990s consisted of the technique of using matrices of charge coupled devices (CCDs), requiring a device for measuring the voltage obtained by the conversion of the charge current generated by the light radiation.

In recent years it has been endeavored to miniaturize the pixels obtained, for the purpose of associating them in active matrix form with a high pixel density and thus of providing high-resolution images.

It is within this context that image sensors based on CMOS (complementary metal-oxide semiconductor) technology have recently been developed. Each pixel of a CMOS pixel active-matrix image sensor typically contains a photodetector element (photodiode or phototransistor) and a transistor circuit intended to read the signal from the pixel). Depending on the photodetector chosen and its circuit for connection to the read transistor, the electrical signal obtained may be proportional to the dose or to the flux of photons received.

These CMOS sensors have many advantages over CCD sensors, including a lower energy consumption, easier fabrication and lower cost.

One of the main challenges in the current development of imagers is to maintain good sensitivity to the radiation while further reducing the size of the pixels used.

One known solution for significantly reducing the size of the pixels is to maximize the fill factor defined as the ratio of the sensitive area of the pixel to its total area. To do this, one known solution is to reduce the size of the "design rules" for the production of the address transistors and the transistors for amplifying and reading the signal coming from the photodetector, and of their interconnects. Another known solution is to reduce the number of transistors used for addressing and for amplifying and reading the signal generated by the photodetector. For example, such a reduction is achieved by sharing the amplification circuit between several adjacent pixels.

It is also known to use chemically functionalized carbon nanotubes or photosensitive polymer/carbon nanotube composites to obtain materials having photovoltaic properties (i.e. those generating an electric voltage or current when illuminated).

Thus, Star et al. have shown in the article "Nanotube Optoelectronic Memory Devices" by Alexander Star, Yu Lu, Keith Bradley and George Gruner, American Chemical Society, published on the Internet on 16/06/2004 that if a drop of a photoconductive polymer is deposited on a packet or "mat" of nanotubes, which is formed from an undifferentiated mixture of metal nanotubes and semiconductors and is placed between two contact electrodes and above a gate electrode, from which it is isolated by a dielectric, then a field-effect phototransistor is obtained.

More precisely, Star et al. have shown that the conductivity of this nanotube packet increases under illumination at a wavelength at which this polymer absorbs the photons and that this increase in conductivity is partly maintained after this illumination has stopped.

Star et al. have also shown in this article that the application of an AC voltage to the gate electrode of this phototransistor makes it possible to reduce the conductivity of the "mat" so as to return it to its initial value after a few minutes, the application of high gate voltages enabling the conductivity to be reset more rapidly.

A major drawback of this light detection/storage device obtained by Star et al. lies in particular in the use of this composite packet of metal nanotubes and semiconductors, which does not make it possible actually to obtain an "off" (i.e. nonconducting) state of the phototransistor and consequently a high sensitivity of the conductivity of the phototransistor to the light illumination.

Other drawbacks of this packet device of Star et al. lie in the relatively slow resetting of the phototransistor thus formed. Furthermore, the relatively large dimensions of the contact electrodes, each having a width of 1 µm and separated from one another by a distance of 50 µm, do not allow several elements to be combined for the purpose of creating a pixel matrix.

SUMMARY OF THE INVENTION

The present invention aims to mitigate the drawbacks of the above devices and to significantly increase the fill factor obtained thanks to smaller and juxtaposable pixels.

The main object of the present invention is to propose an electromagnetic radiation detection and storage device comprising a field-effect phototransistor, which comprises:
  two contact electrodes, namely a source electrode and a drain electrode;
  a nanostructured electrical conduction unit which is connected to said contact electrodes and is coated with at least one photosensitive polymeric coating capable of absorbing said radiation to be detected, of generating electric charges in response, said charges being detected by said conduction unit, and of storing these charges; and
  a gate electrode suitable for controlling the electric current in the unit and the spatial distribution of the charges in said photosensitive coating, which gate electrode is separated from said unit by a gate dielectric,
which remedies all of the aforementioned drawbacks by being suitable for forming at least one imaging pixel.

For this purpose, this device according to the invention is such that said conduction unit comprises at least one semiconductor-type nanotube or nanowire capable of delivering an electrical signal representative of a modification in the conductivity of said phototransistor, having been exposed to radiation, and that said gate dielectric has a thickness e between said contact electrodes and a relative permittivity $\in_r$ that satisfy the condition: $\in_r/e \geq 0.2$ nm$^{-1}$ in such a way that said conductivity after exposure to the radiation can be electrically reset in a minimized time, resuming its value prior to this exposure.

The Applicant has established that this use of a gate dielectric satisfying the condition: $\in_r/e \geq 0.2$ nm$^{-1}$ and preferably the condition: $\in_r/e \geq 0.4$ nm$^{-1}$ allows very effective electrostatic control of the electric charge in the nanotube(s) or nanowire(s) and in the photosensitive coating. This results in the device forming the pixel of the invention being reset extremely effectively and at any instant, irrespective of the intensity of the radiation received, by application of a negative voltage pulse applied to the gate electrode.

Preferably, this thickness e of said dielectric is equal to or less than 20 nm and even more preferably is between 2 nm and 12 nm.

It should be noted that the use of a gate dielectric thickness of greater than 20 nm would not allow the electric charges trapped in said photosensitive polymeric coating to be effectively recombined.

In general, it should be noted that said conduction unit according to the invention may thus comprise:
- a single nanotube or nanowire which is connected to said contact electrodes via its respective ends; or
- several (typically from two to ten for example) nanotubes or nanowires, at least two of which are connected to the source electrode and to the drain electrode respectively and via which the electrical conduction between these two electrodes is exclusively through these nanotubes or nanowires and, preferably in this second case, each nanotube or nanowire is connected "in parallel" via its ends to said source and drain electrodes.

Advantageously in either case, said or each nanotube or nanowire of which said unit is composed is specifically chosen to be of semiconductor type. This makes it possible to obtain a satisfactory "off" state of the phototransistor and therefore to maximize the difference in conductivity of said phototransistor in response to the radiation.

To give an indication, it should be noted that the device according to the invention thus makes it possible to modify the conductivity possibly up to a factor of about 10,000, compared with factors obtained with the field-effect phototransistors of the prior art, such as that described in the aforementioned article by Star et al., which are only around 5.

Preferably, said or each nanotube is a carbon nanotube, which may be of the single-walled (SWNT) or multi-walled (MWNT) type and, even more preferably, a single-walled carbon nanotube is used for said or each nanotube. This is because the small diameter that a single-walled carbon nanotube has makes it possible to minimize the distance between the electric charges localized in the or each nanotube and the interface between said gate dielectric and said photosensitive coating.

The or each single-walled carbon nanotube may advantageously have a diameter of 3.5 nm or less, whereas this diameter may range up to 50 nm in the case of a multi-walled nanotube.

As nanowire(s) that can be used in said conduction unit, it is advantageous to use one or more silicon nanowires advantageously having a diameter of 15 nm or less.

According to another feature of the invention, said conduction unit is designed to detect the radiation on the basis of its effects on the electric charge of said photosensitive coating (i.e. on the basis of the charges photo-induced in the latter) producing, throughout the entire duration of each exposure to the radiation and following it, an electrical signal whose intensity is representative of this exposure.

In fact, when said photosensitive coating absorbs a photon, this is converted into an electron-hole pair. The hole (positive charge) diffuses into the nanotube(s) and the electron remains trapped in this coating. It follows that the photosensitive coating is negatively charged, this negative charge inducing a positive charge in the nanotube(s) in the same way that a negative voltage on the gate electrode induces a positive charge in this or these nanotubes.

It should be noted that these radiation detection and storage or read functions give the corresponding pixel a satisfactory capability of integrating the radiation dose absorbed and transmitted by the photosensitive coating, with a response time of less than one second.

It should also be noted that the photoelectric effect inherent in the operation of the device according to the invention is reflected in a dynamic based on photo-induced charge transfer within said photosensitive coating and that the aforementioned electrical signal delivered by said conduction unit lasts at least as long as the exposure to the illumination. Advantageously, the intensity of this electrical signal obtained with the device of the invention increases with time for as long as this exposure lasts.

According to another feature of the invention, said photosensitive coating is advantageously formed from a film having an average thickness of between 3 nm and 10 nm, which covers said contact electrodes, said gate dielectric and said conduction unit, functionalizing the wall of said or each nanotube or nanowire.

Specifically, the Applicant has established that this small thickness of said photosensitive coating allows the localization of the effect of the electric charges trapped in this coating to be optimally controlled and also contributes to the markedly improved sensitivity of the device of the invention, which sensitivity may be characterized by a conductivity modification factor of about 10,000, as indicated above.

According to another feature of the invention, said photosensitive coating is based on at least one photoconductive polymer, especially one that is photoconductive in the visible and near-ultraviolet ranges, which is capable of generating and of separating said charges during each exposure to said radiation in its absorption bands, without being impaired by this exposure.

Advantageously, said polymer is chosen from the group consisting of polythiophenes, polythiophene derivatives, such as polyalkylthiophenes, poly-N-vinylcarbazoles, polyvinyl pyrenes and polyparaphenylene vinylenes or derivatives and, even more advantageously, it is chosen from the group consisting of poly(3-octylthiophene-2,5-diyl), poly{(m-phenylene-vinylene)-co-[(2,5-dioctyloxy-p-phenylene) vinylene]} and poly(3-hexylthiophene).

It should be noted that photoconductive polymers other than those mentioned above can be used in the device of the invention and that, in general, each polymer used in said photosensitive coating is designed to absorb radiation in a region of the spectrum specific thereto. Within the framework of producing a "color" imager, it is thus possible to use several devices according to the invention each incorporating a photosensitive coating based on a polymer specifically sensitive to a predetermined region of the spectrum, especially in the visible and near-ultraviolet ranges.

It should also be noted that the photoconductive polymer used in the or each photosensitive coating may be doped with a compound that shifts the wavelengths of the absorption band of this coating.

According to another feature of the invention, the device of the invention may further include at least one positioning pad suitable for positioning said conduction unit on said gate dielectric and formed by a monolayer locally covering said gate dielectric, said or each nanotube or nanowire adhering to said or each corresponding pad.

Advantageously, said or each pad may be based on an aminosilane.

According to another advantageous feature of the invention, said contact electrodes each have a width of less than 0.5 μm, even more advantageously of 0.3 μm or less, and are separated from each other by a distance of less than 1 μm, even more advantageously of 0.4 μm or less.

It should be noted that these two dimensions characterizing said contact electrodes are very much smaller than the corresponding dimensions of 1 μm and 50 μm used for the phototransistor described in the aforementioned article by Star et al. and that the miniaturization obtained for the pixels bounded by these electrodes of extremely small size enables several devices according to the invention to be used in order to form dense matrices of pixels.

As materials that can be used to form said contact electrodes, mention may be made of any metallic material such as, nonlimitingly, a metal chosen from the group consisting of Au, Pd, Ti, Al, Cr, Cu, Pt and Co and alloys of these metals.

According to another feature of the invention, said gate electrode may be formed from a metallic material or a semiconductor such as, nonlimitingly, silicon.

According to another feature of the invention, said gate dielectric may be based on any electrically insulating material that can be used in a gate of a field-effect transistor comprising one or more carbon nanotubes. Advantageously, this dielectric is based on at least one metal oxide, the relative permittivity $\in_r$ of which is equal to or greater than 4, such as, nonlimitingly, $Al_2O_3$, $ZrO_2$ or $HfO_2$.

An imager according to the invention is such that it comprises at least two devices according to the invention as defined above, forming adjacent imaging pixels respectively that are each based on said phototransistor, in such a way that the photosensitive coatings of the phototransistors corresponding to said pixels are respectively capable of absorbing identical or different wavelength bands of the electromagnetic spectrum.

According to another feature of this imager of the invention, each of said pixels has an area of less than 1 $\mu m^2$, for example substantially equal to 0.5 $\mu m^2$ or 0.1 $\mu m^2$, this miniaturization making it possible to form dense pixel matrices.

It should be noted that the arrangement according to the invention of the all-semiconductor nanotube(s) (with a small number (preferably 10 or less) in the case of a plurality of nanotubes) combined with the particular geometry of the or each photosensitive coating (with a small thickness and covering a nanotube or a small number of nanotubes) make it possible to obtain controlled pixel areas, i.e. in accordance with those desired. The combination of these two essential features of the invention thus makes it possible to obtain pixels all having substantially the same dimensions and therefore capable of being assembled into a pixel matrix.

According to one embodiment of this imager of the invention, said gate electrode provided with said dielectric is common to all of said pixels.

According to an alternative embodiment of this imager of the invention, said gate electrode is relative to each of said pixels, with as many corresponding gate electrodes as there are pixels.

A process for fabricating a radiation detection/storage device according to the invention as defined above essentially comprises:

a) localized deposition, on said gate dielectric of a substrate, of at least one positioning pad formed of a monolayer, for example one based on an aminosilane;

b) selective deposition, on said or each pad, of said or each nanotube or nanowire in solution;

c) formation of said contact electrodes on said nanotube(s) by masking that zone of said or each nanotube capable of being functionalized according to step d) below, followed by deposition of metal and by "lift-off" (i.e. cleaning the mask and the metal residues not forming these contact electrodes); and then d) deposition of said photosensitive polymeric coating, for example deposited by spin coating, on said nanotube(s) or nanowire(s) in order to functionalize it or them, on said gate dielectric and on said contact electrodes that are connected to said nanotube(s) or nanowire(s).

However, it should be noted that it is possible to obtain the arrangement of the conduction unit based on one or more functionalized nanotubes or nanowires according to the invention on the substrate via other processes, for example via a CVD (Chemical Vapor Deposition) technique carried out directly on this substrate, before the photosensitive coating is deposited.

However, it should be noted that it is possible to position one or more conduction units based on one or more functionalized nanotubes or nanowires according to the invention on the substrate via other processes (without the aforementioned pads). As examples, mention may be made of CVD techniques and growth processes carried out directly on the substrate, before the photosensitive coating is deposited. In the case of growth processes, the device according to the invention may include catalyst particles that are designed, in terms of size, position and composition, to allow said or each nanotube to be grown on said gate dielectric, so as to form said conduction unit.

It should also be noted that it is possible to form the contact electrodes (step c) of the above process) before the conduction units are deposited (step b) of the above process). In this case, the contact electrodes are formed not on the ends of the nanotube(s) but at the precise locations that they have to occupy.

In this case, the process for fabricating a radiation detection/storage device according to the invention as defined above essentially comprises:

a) formation of contact electrodes by a conventional nanofabrication process, these electrodes advantageously being included in the gate dielectric so that their surface is flush with the surface of the latter;

b) localized deposition, on the contact electrodes or on said gate dielectric of a substrate, of at least one positioning pad formed from a monolayer, for example based on an aminosilane deposited on said dielectric or else based on an aminoalkylthiol deposited on the electrodes;

c) selective deposition, on said or each pad, of said or each nanotube or nanowire in solution; and then d) deposition of said photosensitive polymeric coating, for example deposited by spin coating, on said nanotube(s) or nanowire(s) in order to functionalize it or them, on said gate dielectric and on said contact electrodes that are connected to said nanotube(s) or nanowire(s).

It should also be noted that each pixel formed by the device according to the invention may be fabricated on a pre-existing electronic circuit, for example on a pixel address circuit, provided that this has a dielectric surface capable of constituting the gate dielectric. This is in particular the case of the selective positioning process according to the invention described above, enabling nanotubes or nanowires to be attached to desired points on a dielectric surface (e.g. one based on silicon oxide) and without impairing the existing electronic circuit or surface (in particular, no high-temperature annealing is carried out).

It should also be noted that the entire device according to the invention may be fabricated on a film which is flexible and/or transparent, for example to visible radiation. In this case, starting from such a flexible film, a gate is firstly fabricated, followed by the deposition of the nanotube(s) or nanowire(s), the contact electrodes and finally the photosensitive polymeric coating. The flexible and/or transparent substrate obtained then simply replaces the silicon substrate usually employed.

One use according to the invention of a device as defined above relates to the formation of at least one imaging pixel for detection and storage of electromagnetic control radiation, such as radiation in the visible, near-ultraviolet, X-ray and gamma-ray ranges, in such a way that said or each pixel can be electrically reset in a minimized time, via a voltage pulse applied to said gate electrode.

According to another feature of the invention, this use of said device relates to the formation of a matrix of pixels of an imager, in which matrix only the pixel containing the photosensitive coating, which is specifically capable of absorbing the wavelength band of the control radiation, detects and stores this radiation and, in response, generates said electric charges in order to obtain electrical signals representative of said radiation.

BRIEF DESCRIPTION OF THE DRAWINGS

The aforementioned features of the present invention, together with others, will be better understood on reading the following description of several exemplary embodiments of the invention, given by way of illustration but implying no limitation, said description being in conjunction with the appended drawings in which.

DETAILED DESCRIPTION

Figure 1:
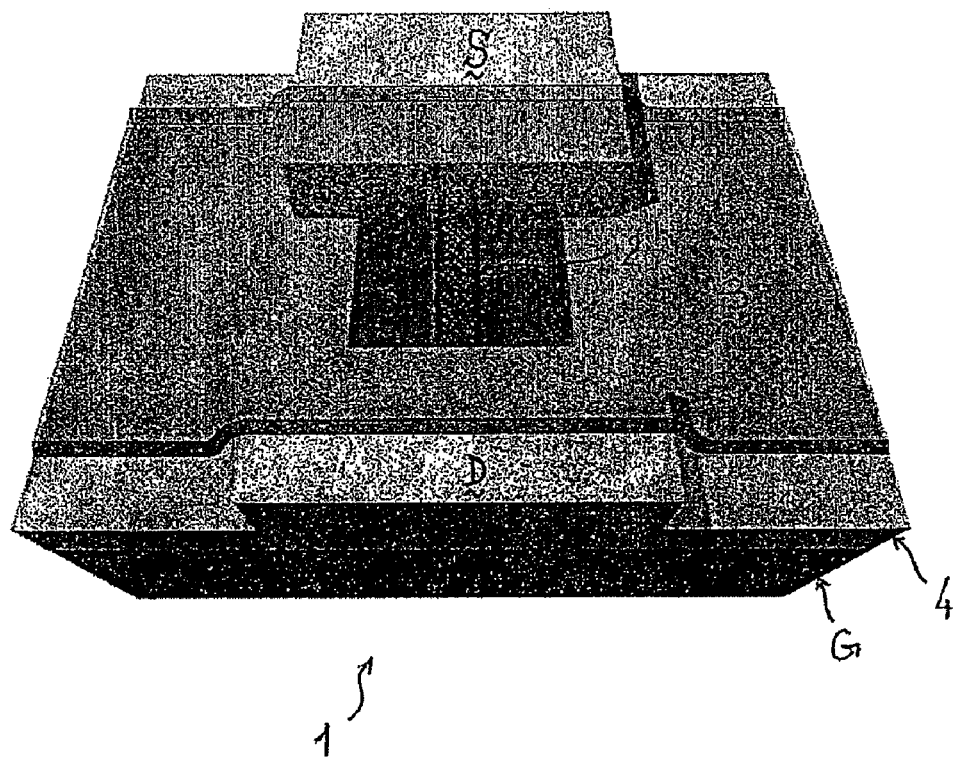
FIG. 1 is a schematic perspective see-through view of a radiation detection/storage device according to one embodiment of the invention having a single nanotube.
Figure 2:
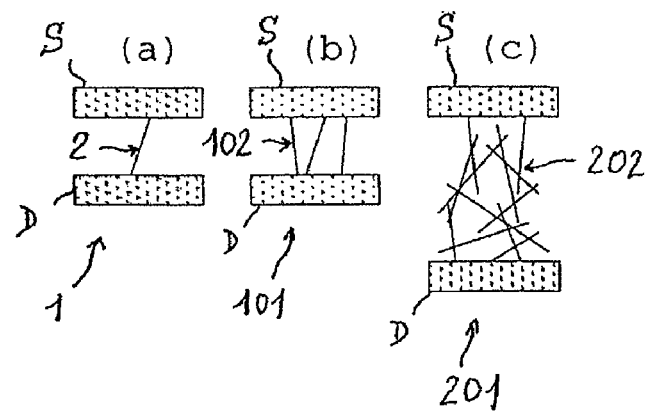
FIG. 2(a) is a diagram illustrating the connection of the single nanotube according to FIG. 1 to two contact electrodes of said device.
FIG. 2(b) is a diagram illustrating the connection of several nanotube in parallel to these contact electrodes according to a variant of FIG. 2(a)
FIG. 2(c) is a diagram illustrating the connection of several nanotubes to these contact electrodes according to a variant of FIG. 2(b)

The device 1 according to one embodiment of the invention, illustrated in FIGS. 1 and 2(a), is of the field-effect phototransistor type and essentially comprises:

two contact electrodes S and D, namely the source electrode and drain electrode respectively, which are for example made of palladium;

a nanostructured electrical conduction unit, consisting in this example of one single-walled carbon nanotube 2 connected to the electrodes S and D via its ends and functionalized by a photosensitive polymeric coating 3 that covers it; and a gate electrode G, for example made of silicon, which is designed to control the electric current in the nanotube 2 and is separated therefrom by a gate dielectric 4 (for example made of silicon dioxide) on which the nanotube 2 is placed.

The photosensitive coating 3, for example consisting of a poly(3-octylthiophene-2,5-diyl) known by the name "P3OT", is capable of absorbing predetermined radiation bands, of generating, in response, electric charges and of transmitting them to the nanotube 2 for their storage, the latter being capable of delivering an electrical signal representative of the conductivity of the device 1 that has been exposed to these radiation bands.

Also visible in FIG. 1 is an optional positioning pad that allows the nanotube 2 to be positioned at a predetermined location on the gate dielectric 4 and is formed from a monolayer made in this example of APTS (aminopropyltriethoxysilane), suitable for the nanotube 2 to adhere thereto.

More precisely:

the nanotube 2 has a diameter of less than 3.5 nm and a length possibly ranging from 100 nm to 1 µm;

the photosensitive coating 3 has a thickness of between 3 nm and 10 nm;

the dielectric 4 has a thickness of 10 nm; and the contact electrodes S and D have a thickness of about 30 nm and a width (defining the lateral dimension of the pixel obtained) of about 100 nm.

The device 101 according to the invention illustrated in FIG. 2(b) differs only from that of FIGS. 1 and 2(a) in that the conduction unit consists of several nanotubes 102 connected "in parallel" to the contact electrodes S and D, i.e. each having their respective ends connected to these electrodes S and D.

The device 201 according to the invention illustrated in FIG. 2(c) differs only from that of FIG. 2(b) in that the nanotubes 202 constituting the conduction unit are arranged in an entangled manner, so as to form conduction channels between the two electrodes S and D that are formed exclusively by these nanotubes 202.

The detection/storage devices 1, 101, 201 according to FIGS. 2(a) to 2(c) are for example fabricated in the following manner.

a) Firstly, a highly doped silicon substrate is prepared, provided with a two-part $SiO_2$ layer, comprising:

a 200 nm thick $SiO_2$ sublayer located beneath macroscopic connection contacts and intended to limit the leakage and capacitive currents; and a 10 nm thick high-quality thermal $SiO_2$ sublayer, which is located at the center of the substrate and serves as dielectric 4 for this substrate.

b) Secondly, the carbon nanotube or nanotubes 2 are placed on the dielectric 4, preferably using a technique of selectively positioning the nanotube or nanotubes 2 on the dielectric 4, which is implemented as follows:

one or more regions for this positioning are defined using an electron-beam lithography technique, by means of a PMMA (polymethyl methacrylate) mask on the dielectric 4, and an aminosilane monolayer is formed in these regions, by treating the specimen with EDA (ethylenediamine) and then, afterwards, with APTS (aminopropyltriethoxysilane) starting from the vapor phase;

after a "lift-off", the specimen obtained is immersed in a dispersion of carbon nanotube(s) (2) in NMP (N-methylpyrrolidone);

the aforementioned monolayer having an amine terminal group acts as an adhesive pad to which the nanotube(s) is (are) selectively bonded in the predefined region or regions; and next, this or these regions is or are connected via the contact electrodes S and D.

c) A P3OT polymeric film 3 is deposited by spin coating with a thickness of about 5 nm in a 0.1% solution in toluene on the substrate thus obtained, i.e. on the dielectric 4, partly on the electrodes S and D and on the nanotube(s) 2, 102, 202, as illustrated in FIG. 1.

It should be noted that the thickness of this film 3 was for example measured by AFM (atomic force microscopy) and by absorption spectroscopy on glass (other measurement methods can be used).

The device 1, 101, 201 of the field-effect phototransistor type according to the invention is thus obtained.

Tests Carried Out on the Device 1 of FIG. 1:

Laser radiation of 457 nm wavelength with a transverse beam size of 2 μm was used and, for the electrical measurements, a constant drain-source voltage $V_{ds}$ of −400 mV was used. The following characteristics of this device 1 were in particular measured:

the optical switching dynamic (charging/retention time);

the link between dynamic and gate voltage (rapid effects at $V_{gs}<0$ and memory effect at $V_{gs}>0$);

the link between the magnitude of the effect and the wavelength of the light;

the link between the magnitude of the effect and the number of photons (optical power); and the local aspect of the effect, showing that if the laser spot is applied on the photosensitive coating but 10 μm from the device, no effect is observable, indicating that the adjacent pixels within a pixel matrix of an imager will not detect the same photons (the light arriving on a pixel not modifying the conductivity of the nanotubes constituting the adjacent pixels, even if this coating uniformly covers all of the pixels).

1) Magnitude of the Effect Manifesting the Sensitivity of the Pixel Obtained by the Device 1:

In order for an imager pixel to be effective, it is necessary in particular:

(i) for the light to cause sufficiently significant electrical modifications (so as to ensure a good signal-to-noise ratio); and (ii) for these electrical modifications to be dependent on the optical power, for power levels covering several orders of magnitude (i.e. the possibility of detecting low power levels, coupled with absence of saturation for high power levels).

Figure 3:
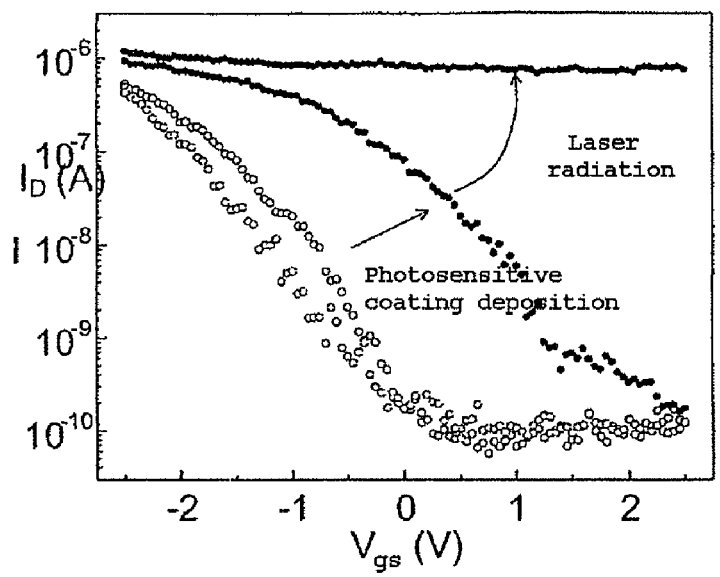
FIG. 3 is a current/voltage graph illustrating the measured effect of visible laser radiation on the device of FIG. 1, before and after the deposition of a photosensitive polymeric coating on said nanotube.

The validation of point (i) is illustrated in FIG. 3, which shows that a transistor covered with a photosensitive film of P3OT polymer a few nanometers in thickness sees its conductivity increase by four orders of magnitude (at $V_{gs}=+2.5$ V) when it is exposed to illumination at a wavelength for which this polymer absorbs the photons. The transistor biased at $V_{gs}>0$ switches from an off state ($I<10^{-10}$ A) to an on state (I close to $10^{-6}$ A).

It should be noted that such a difference between the illuminated and nonilluminated states guarantees detection quality within the framework of an imager pixel. This is because the visible noise in the curves is completely negligible relative to the modifications induced by the light.

Figure 4:
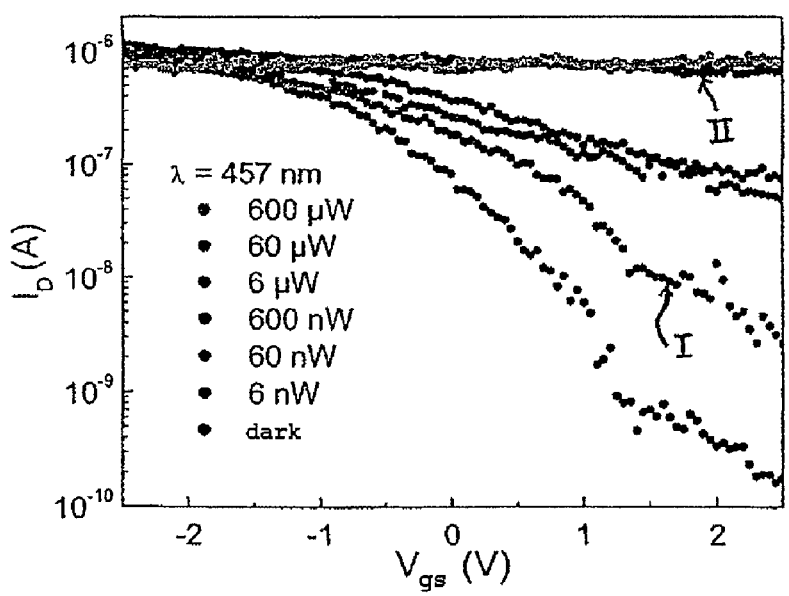
FIG. 4 is a current/voltage graph illustrating the effect of the power of this same radiation on the same device of FIG. 1.

2) Effect of the Optical Power of the Radiation on the Conductivity Modification of the Device 1:

The conductivity modification of the device 1 was studied as a function of the optical power (number of incident photons). FIG. 4 shows that the nanotube conductance modifications (in particular at $V_g>0$) may be adjusted over several orders of magnitude according to the optical power.

In particular, this FIG. 4 shows that a pixel exposed to a power of $6·10^{-9}$ W (cf. curve I) sees its conductivity increase by a factor of 10, whereas a pixel exposed to a power of $6·10^{-6}$ W (saturation threshold of the effect, cf. curve II) sees its conductivity increase by a factor of about 10,000. Thus, such a pixel enables optical power differences to be measured over at least 4 orders of magnitude.

Figure 5:
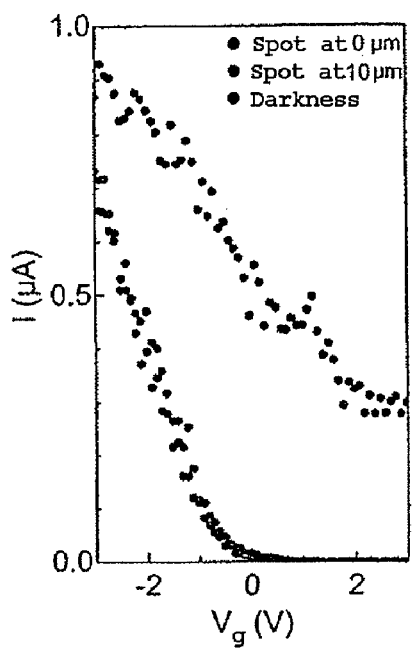
FIG. 5 is a current/voltage graph illustrating the effect of the localization of the impact of this radiation on the device of FIG. 1.

3) Local Character of the Effect on the Device 1, Reflecting the Individualization of the Pixels Formed by Devices 1:

Another very important parameter for evaluating the quality of an imager pixel is the local character of the effect, i.e. a light impact does not excite the adjacent pixels. As illustrated in FIG. 5, it has been confirmed that photon detection does not take place when the laser spot is positioned at 10 μm from the pixel, even though the polymer film covers the entire device (1 cm²). The polymer charging effects are highly localized within the photon absorption zone. It is probable that this 10 μm distance is an overestimate of the minimum distance between two pixels, the effect being without doubt even more local.

In view of FIG. 5, it seems that the photons detected by a pixel formed by the device 1 would have very little or no effect on the adjacent pixels.

4) Sensitivity of the Device 1 to the Dose Rather than to the Photon Flux, Manifesting its Integration of the Number of these Photons:

Another important criterion for evaluating an imager pixel is the dynamic of the electrical response at an influx of the photons. This is because it is important for the pixel to accumulate (i.e. integrate) the light dose (i.e. the number of photons) over the course of time. In a camera for example, all of the light collected during the diaphragm opening time must be taken into account, enabling photographs to be taken under very dark conditions by increasing the exposure time.

Figure 6:
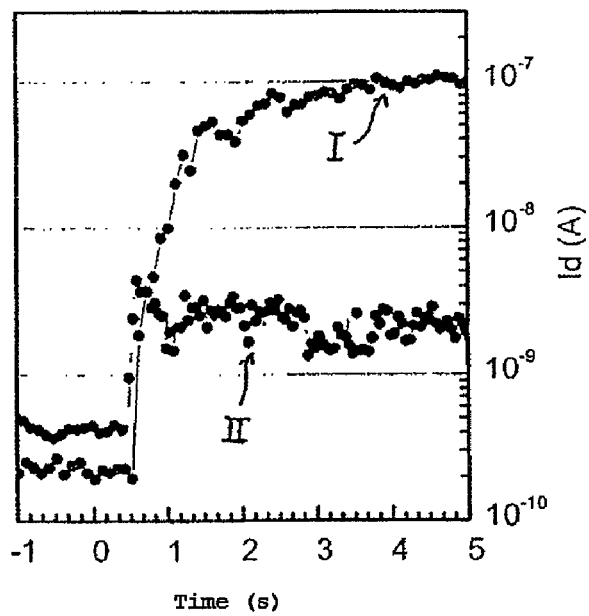
FIG. 6 is a current/time graph illustrating the effect of integration of this radiation by the device of FIG. 1, on the one hand for illumination in continuous form and, on the other hand, for illumination in pulse form.

FIG. 6 compares the conductivity change dynamic of the device for the continuous influx of light (curve I) and with a 100 ms light pulse (curve II).

Curve I shows that during the first second of continuous illumination, the device 1 has an almost linear response as a function of time and that, thereafter, the conductivity changes more slowly toward saturation. Thus, for illuminations of short duration (those of technological interest), the pixel acts well as an integrator.

It has been verified by curve II that if the device 1 is illuminated only for 100 ms, the conductivity of the device 1 stabilizes to an intermediate value corresponding exactly to that indicated by curve I after 100 ms of illumination.

5) Storage of the Change in Conductivity of the Device 1, Manifesting Corresponding Pixel Read:

Another parameter essential to good operation of the pixel is for there to be a certain retention time. This is because, after being exposed to light, the value of the pixel (i.e. its conductivity) must be read by the signal processing electronics associated with the imager. It may be seen in curve II of FIG. 6 and in FIG. 7 that, when the light is turned off, the conductivity value is maintained for a very long time, i.e. much longer than the minimum time needed to read the pixel.

6) Resetting of the Conductivity of the Device 1 and Therefore of the Corresponding Pixel:

Finally, one critical parameter for using the device 1 as an imager pixel relates to the possibility of resetting the pixel to its initial (dark) value. This is because, after having integrated the number of photons over a certain time, the conductivity value is read and then must be able to be reset so as to allow another detection. This resetting must be effective (i.e. by a complete return to the initial value) and also rapid. The resetting time is, with the sensitivity already mentioned, thereby fixing the overall speed of the device 1.

Figure 7:
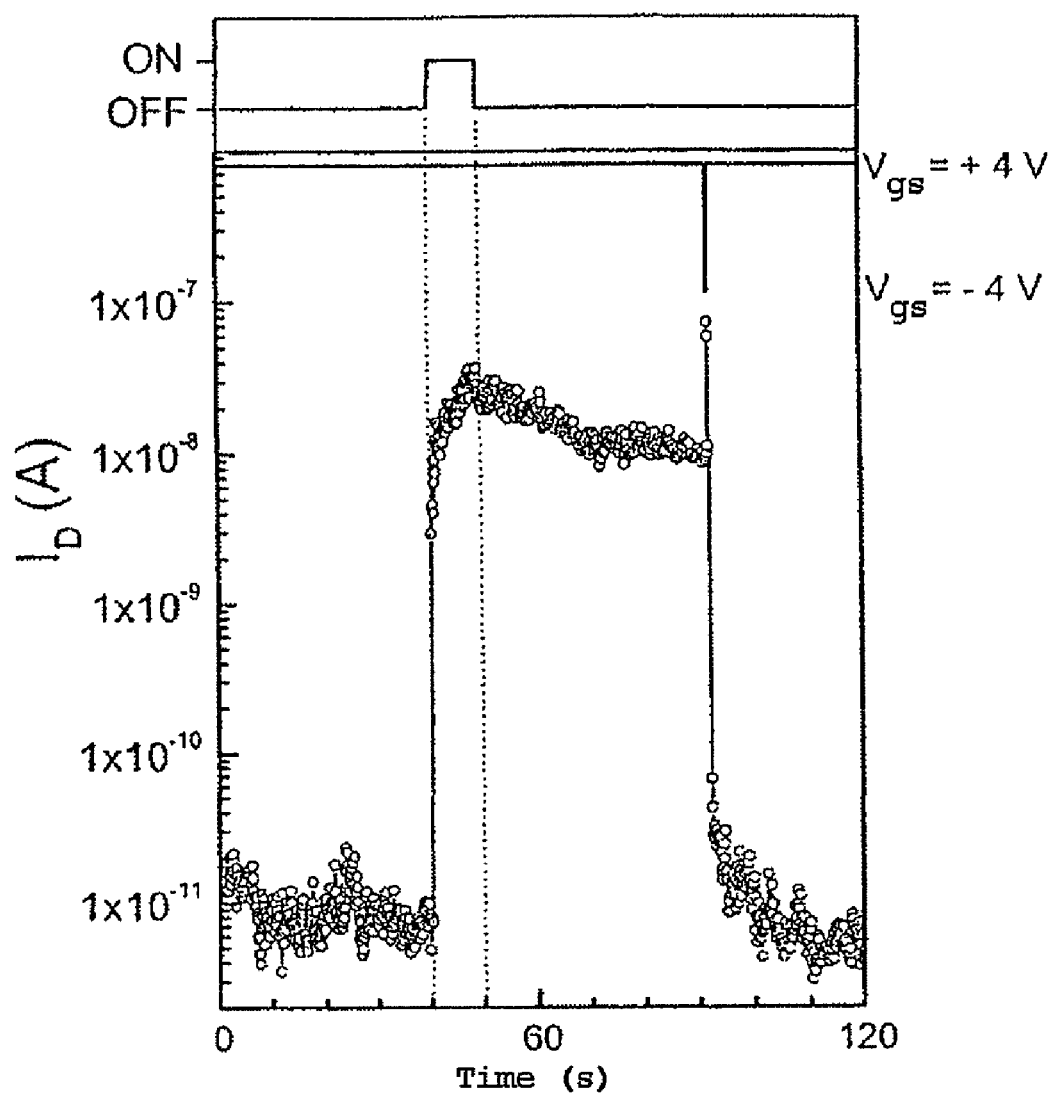
FIG. 7 is a current/time graph illustrating the electrical resetting of the device of FIG. 1 via a gate voltage pulse, after continuous illumination via the aforementioned radiation.

FIG. 7 shows that, after exposure to the light, a −4 V voltage pulse on the gate electrode for a time of 100 ms is sufficient to reset the device 1 very effectively.

It should be noted that this FIG. 7 clearly demonstrates the significant increase in the quality and in the speed of pixel resetting obtained by the device according to the present invention, in comparison with the prior art. This greatly enhanced resetting quality/speed is due in particular to the efficiency of the electrostatic gate, obtained by having a small thickness (less than 20 nm) used for the gate dielectric.

In conclusion, these test results show that the extension of a single pixel formed by the device according to the invention to a dense pixel matrix can be achieved under good miniaturization (pixel size less than 0.5 µm) and operating conditions.

The invention claimed is:

1. An electromagnetic radiation detection and storage device comprising a field-effect phototransistor, which comprises:
    two contact electrodes, namely a source electrode and a drain electrode respectively;
    a nanostructured electrical conduction unit which is connected to said contact electrodes and is coated with at least one photosensitive polymeric coating capable of absorbing said radiation to be detected, of generating electric charges in response, said charges being detected by said conduction unit, and of storing these charges; and
    a gate electrode suitable for controlling the electric current in said unit and the spatial distribution of the charges in said photosensitive coating, which gate electrode is separated from said unit by a gate dielectric,
    characterized in that said conduction unit comprises at least one semiconductor-type nanotube or nanowire capable of delivering an electrical signal representative of a modification in the conductivity of said phototransistor, having been exposed to radiation, and in that said gate dielectric has a thickness e between said contact electrodes and a relative permittivity $\in r$ that satisfy the condition: $\in r/e \geq 0.2$ nm-1, in such a way that said conductivity after exposure to said radiation can be electrically reset in a minimized time and said device forms at least one imaging pixel and is useable to form a matrix of pixels.

2. The device as claimed in claim 1, characterized in that said conduction unit is designed to detect said radiation on the basis of said charges photo-induced in said photosensitive coating, producing, throughout the entire duration of each exposure to said radiation and following it, an electrical signal whose intensity is representative of this exposure.

3. The device as claimed in claim 1, characterized in that said photosensitive coating is formed from a film having an average thickness of between 3 nm and 10 nm, which covers said contact electrodes, said gate dielectric and said conduction unit, functionalizing the wall of said or each nanotube or nanowire.

4. The device as claimed in claim 3, characterized in that said thickness e and said relative permittivity $\in r$ of said dielectric satisfy the condition: $\in r/e \geq 0.4$ nm-1.

5. The device as claimed in claim 1, characterized in that said thickness e is equal to or less than 20 nm.

6. The device as claimed in claim 1, characterized in that said gate dielectric is based on at least one metal oxide, the relative permittivity $\in r$ of which is equal to or greater than 4.

7. The device as claimed in claim 1, characterized in that said or each nanotube or nanowire of said unit is of semiconductor type.

8. The device as claimed in claim 1, characterized in that said photosensitive coating is based on at least one photoconductive polymer that is photoconductive in the visible and near-ultraviolet ranges, which is capable of generating and of separating said charges during each exposure to said radiation in its absorption bands, without being impaired by this exposure.

9. The device as claimed in claim 8, characterized in that said polymer is chosen from the group consisting of polythiophenes, polyalkylthiophenes, poly-N-vinylcarbazoles, polyvinyl pyrenes and polyparaphenylene vinylenes.

10. The device as claimed in claim 1, characterized in that it further includes at least one pad for positioning said conduction unit, which is formed by a monolayer locally covering said gate dielectric, said or each nanotube or nanowire adhering to said or each corresponding pad.

11. The device as claimed in claim 10, characterized in that said or each pad is based on an aminosilane.

12. The device as claimed in claim 1, characterized in that said or each nanotube or nanowire is a single-walled carbon nanotube or a silicon nanowire respectively.

13. The device as claimed in claim 1, characterized in that said contact electrodes each have a width of less than 0.5 µm and are separated from each other by a distance of less than 1 µm.

14. The device as claimed in claim 1, characterized in that said unit comprises a single nanotube or nanowire which is connected to said contact electrodes via its respective ends.

15. The device as claimed in claim 1, characterized in that said unit comprises several nanotubes or nanowires, at least two of which are connected to said source electrode and to said drain electrode respectively and via which the electrical conduction between these two electrodes is exclusively through these nanotubes or nanowires.

16. The device as claimed in claim 15, characterized in that said unit comprises several nanotubes or nanowires, each of them being connected via its ends to said source and drain electrodes.

17. An imager, characterized in that it comprises at least two devices as claimed in claim 1, forming adjacent imaging pixels respectively that are each based on said phototransistor, in such a way that the photosensitive coatings of the phototransistors corresponding to said pixels are respectively capable of absorbing identical or different wavelength bands of the electromagnetic spectrum.

18. The imager as claimed in claim 17, characterized in that each of said pixels has an area of less than 1 µm².

19. The imager as claimed in claim 17, characterized in that said gate electrode provided with said dielectric is common to all of said pixels.

20. The imager as claimed in claim 17, characterized in that said gate electrode is relative to each of said pixels, with as many corresponding gate electrodes as there are pixels.

* * * * *